United States Patent
Liang et al.

(10) Patent No.: US 8,985,832 B2
(45) Date of Patent: Mar. 24, 2015

(54) QUICK INSTALLATION MULTIFUNCTIONAL DISPLAY

(75) Inventors: Jun Liang, Hunan (CN); Wenying Yong, Hunan (CN); Zhan Liang, Hunan (CN)

(73) Assignee: Hunan Xiny Asheng Technology & Development Co., Ltd., Changsha (CN)

( * ) Notice: Subject to any disclaimer, the term of this patent is extended or adjusted under 35 U.S.C. 154(b) by 98 days.

(21) Appl. No.: 13/814,937

(22) PCT Filed: Jun. 1, 2012

(86) PCT No.: PCT/CN2012/076402
§ 371 (c)(1),
(2), (4) Date: Feb. 8, 2013

(87) PCT Pub. No.: WO2013/149432
PCT Pub. Date: Oct. 10, 2013

(65) Prior Publication Data
US 2013/0265765 A1    Oct. 10, 2013

(51) Int. Cl.
G09F 13/04    (2006.01)
F21V 21/005   (2006.01)
H05K 5/02     (2006.01)
G09F 9/302    (2006.01)

(52) U.S. Cl.
CPC ............ H05K 5/0208 (2013.01); G09F 9/3026 (2013.01)
USPC ............. 362/630; 362/634; 362/97.1; 349/58

(58) Field of Classification Search
CPC .......... G02F 1/133308; G02F 1/133336; G02F 1/133608; G09F 9/3026; H05K 5/0021
USPC ................... 362/559, 630, 634, 97.1; 349/58; 345/1.3
See application file for complete search history.

(56) References Cited

U.S. PATENT DOCUMENTS

| | | | |
|---|---|---|---|
| 6,314,669 B1* | 11/2001 | Tucker | 40/448 |
| 6,704,989 B1* | 3/2004 | Lutz et al. | 29/428 |
| 6,926,375 B2* | 8/2005 | Nagamine et al. | 312/111 |
| 6,989,800 B2* | 1/2006 | McLaughlin | 345/1.3 |
| 7,774,968 B2* | 8/2010 | Nearman et al. | 40/605 |
| 7,997,550 B2* | 8/2011 | Kuhn | 248/276.1 |
| 8,259,447 B2* | 9/2012 | Shimizu | 361/690 |
| 2008/0218370 A1* | 9/2008 | Tennagels | 340/815.45 |
| 2012/0139815 A1* | 6/2012 | Aono et al. | 345/1.3 |

FOREIGN PATENT DOCUMENTS

| | | |
|---|---|---|
| CN | 201584124 U | 9/2010 |
| CN | 201780736 U | 3/2011 |
| CN | 202072181 U | 12/2011 |

OTHER PUBLICATIONS

International Search Report issued for PCT Application No. PCT/CN2012/076402 by the International Search Authority.

* cited by examiner

*Primary Examiner* — Peggy Neils

(57) ABSTRACT

The invention relates to a quick installation multifunctional display comprising at least two display units, connecting pieces for connecting the display units together; said display unit comprises a frame formed by four side walls, and through-holes are formed in the side walls of the frame, said connecting pieces connect the display units together by the through-holes in the side walls of the frame. The quick installation multifunctional display of the present invention could be formed by connecting the display units together through the connecting pieces, which makes the installation very convenient; furthermore, the workload and time for installation of the quick installation multifunctional display could be decreased, which lowers the installation costs.

10 Claims, 7 Drawing Sheets

QUICK INSTALLATION MULTIFUNCTIONAL DISPLAY

FIELD OF THE INVENTION

The present invention relates to a large electronic display device, more particularly, to a quick installation multifunctional display.

BACKGROUND OF THE INVENTION

Large electronic display has become an important advertising medium along with the development of advertising, and has been widely used in indoor and outdoor public places. However, installation of this large electronic display is a heavy work and is time consuming, 5-6 workers usually have to work 4-5 days to finish the installation, which makes installation costs very high.

SUMMARY OF THE INVENTION

In view of this, it is necessary to provide a quick installation multifunctional display to decrease workload and time for the installation, and thus to solve the technical problem mentioned in the background.

To overcome the shortcomings in the prior art, the technical solution of the present invention, a quick installation multifunctional display, comprises at least two display units, connecting pieces for connecting the display units together; wherein said display unit comprises a frame formed by four side walls, and through-holes are formed in the side walls of the frame, said connecting pieces connect the display units together by the through-holes in the side walls of the frame.

As an improvement of the quick installation multifunctional display of the present invention, said connecting piece comprises a connecting seat, and twist locks respectively connected to two ends of the connecting seat which are rotatable relative to end surfaces of the connecting seat, said connecting seat is sheathed in the through-holes of the side walls of the two adjacent frames, said twist locks lean against inside surfaces of the side walls of the two frames to lock said display units.

As an improvement of the connecting seat of the present invention, said connecting seat comprises two connecting blocks left-right opposite to each other, each of two connecting blocks providing with a turning block on its end and the ends of the two connecting blocks being opposite to each other, a pressing block sleeving outer sides of the turning blocks, a locking block arranged just below two turning blocks, and a locking bolt; wherein said pressing block is in inverted-U shape, two turning blocks are forward-backward symmetrically arranged and their two opposite sides are engaged with each other to be received in U-shaped notch of the pressing block; the top of said pressing block has a hole in the centre thereof, the opposite sides of two turning blocks are respectively provided with big-end-up half holes, and said locking block has a screwed hole in the centre thereof, said locking bolt extends the holes of both the pressing block and the two turning blocks to mesh with the screwed hole of the locking block.

As an improvement of the connecting piece of the present invention, said connecting piece comprises a connecting seat and a twist lock, said connecting seat has a stop block at one end thereof, while the other end is connected with the twist lock which is rotated relative to the connecting seat, the inside surface of said stop block leans against the inside surface of said side wall of one of a frame adjacent to the stop block, while said twist lock leans against the inside surface of said side wall of another frame adjacent to the twist lock to lock said display units.

As an improvement of the connecting piece of the present invention, a blind hole is formed in an end surface of the connecting seat which end surface is abutted against said twist lock, a spring is arranged in the blind hole, a ball is arranged on top of the spring, a slot is arranged at an end surface of the twist lock which end surface is abutted against the connecting seat, and the ball is partially embedded into the slot under the pressure of the spring.

As an improvement of the quick installation multifunctional display of the present invention, outside surface of the side wall of the frame is an inward-inclined plane.

As an improvement of the quick installation multifunctional display of the present invention, the display further comprises a fastener having two ends being protruded outwards in the same direction, one end of the fastener is provided with a screwed hole that connects with a adjusting bolt, while the other end is provided with a connecting hole that connects with said display unit through said connecting pieces, and the quick installation multifunctional display is mounted on a steel frame through the fastener.

As an improvement of the quick installation multifunctional display of the present invention, the display further comprises a hanging assembly, the hanging assembly comprises a hanging beam and at least a hanging ring fixedly connected to the hanging beam, the hanging beam is provided with connecting holes which are connected to said display unit through said connecting pieces, and the quick installation multifunctional display is hanged over a hook via the hanging assembly.

As an improvement of the quick installation multifunctional display of the present invention, said display unit further comprises a cover, and LED light bodies provided under the cover, wherein the cover is positioned at a side of the LED light bodies, and the LED light body has a homocentric square-shaped structure with at least one layer, criss-cross slots are formed in the cover and among the LED light bodies.

As an improvement of the quick installation multifunctional display of the present invention, said display unit further comprises a control box, and the control box is inserted with a heat sink.

When comprising with the prior art, connecting pieces are used in the present invention for connecting the display units together to install the quick installation multifunctional display, which makes the installation very convenient and time-saving; in addition, the workload and time for installation of the quick installation multifunctional display could be decreased, which lowers the installation costs; furthermore, the quick installation multifunctional display of the present invention could be adjusted to a certain radian according to customer's requirement.

Figure 1:
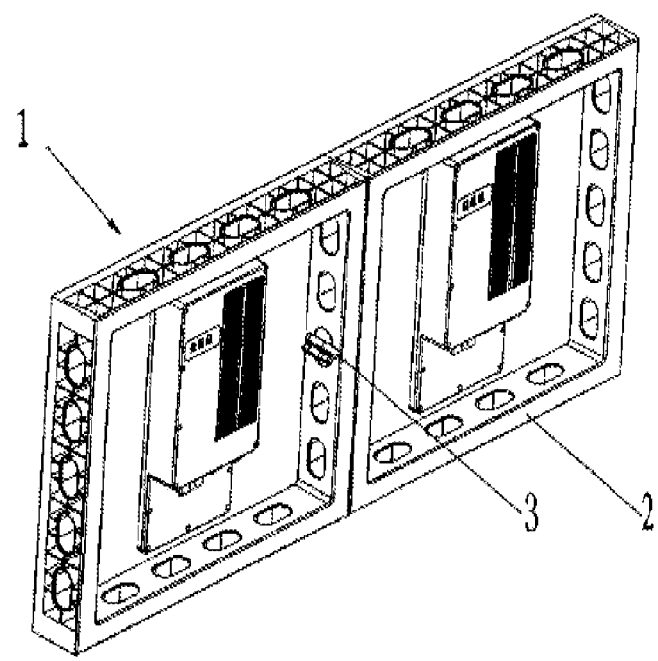
FIG. 1 is a schematic diagram of the quick installation multifunctional display of the present invention.

Numbers in these figures respectively indicate:
a quick installation multifunctional display 1
a display unit 2
a frame 21
a circuit board 22
a cover 23
a homocentric square-shaped structure 231
a slot 232
a control box 24
a heat sink 25
a side wall 211
a through-hole 212
a connecting seat 5, 5b and 5c
a stop block 5b1
a connecting block 51a and 51b
a turning block 52a and 52b
a pressing block 53
a locking block 54
a locking bolt 55
a blind hole 56
a spring 57
a ball 58
a twist lock 6
a fastener 7
a screwed hole 71
a connecting hole 72
an adjusting bolt 73
a hanging assembly 8
a hanging ring 81
a hanging beam 82
a connecting hole 821
a screwed stud 822
a nut 85
a hanging beam connecting plate 86
a steel frame 9
a screw 10
a support 11

DETAILED DESCRIPTION OF THE PREFERRED EMBODIMENTS OF THE INVENTION

Referring to the accompanying drawings, embodiments of the quick installation multifunctional display of the present invention are as follows.

Figure 2:
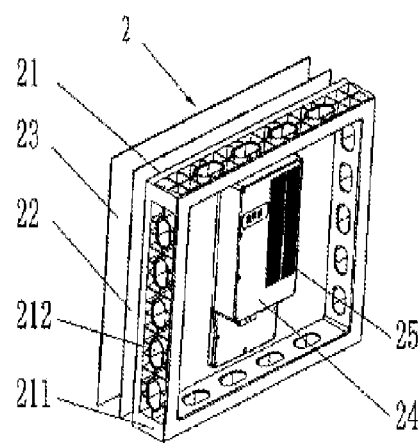
FIG. 2 is a schematic diagram of the display unit of the present invention.

Referring to FIG. 1 and FIG. 2, the quick installation multifunctional display of the present invention comprise at least two display units 2 and a plurality of connecting pieces for connecting the display units 2 together; wherein said display unit 2 comprises a frame 21 formed by four side walls 211, a circuit board 22 positioned closely to outer surface of one end of the frame 21 and fixedly connected to the frame 21, a plurality of LED light bodies arranged on upper surface of the circuit board 22, a cover 23 positioned above the LED light bodies and fixedly connected to the circuit board 22, a control box 24 arranged in the frame 21 and fixedly connected to bottom of the circuit board 22, the circuit board 22 and the control box 24 being electrically connected together, through-holes 212 are formed in the side walls 211 of the frame 21; the connecting pieces 3 connect the display units 2 together by the side walls 211 of the frame 21 to form the quick installation multifunctional display 1 of the present invention.

Said frame 21 could be formed by assembling a plurality of components, as well as by shape casting or injection moulding in one step; while shape casting or injection moulding in one step makes a high overall strength for the frame 21. The material for the frame 21 could be metal or plastic, however, in order to decrease the weight of the display unit and to facilitate its transport and installation, plastic material is better, and polycarbonate (PC) plastic is the best due to its anti-shock and anti-throw performances. The material for the cover 23 is plastic having a good light transmission performance, such as PC or PMMA (known as organic glass).

A plurality of LED light bodies are arranged on the circuit board 22, and the circuit board 22 is electrically connected to the control box 24, the control box 24 then supplies power to the circuit board 22 and the LED light bodies and controls display signals, moreover, the control boxes 24 provided by the display units 2 that are electrically connected to each other through the connecting pieces 3, are also connected with each other to transmit display signals.

For the purpose of resisting dust and water, the cover 23 and the circuit board 22 are poured with sealant therebetween, and the control box 24 has a rubber sealing ring around it.

The control box 24 is inserted with a heat sink 25. Said heat sink is a metal cooling fin, which could be an aluminium alloy cooling fin, and the heat sink is silent and is of high efficiency.

The display unit 2 provided by the quick installation multifunctional display of the present invention is light and thin which facilitate its transport, a variety of combinations of the display units can be realized according to customer's requirement, then the combined display units 2 are connected together by using the connecting pieces 3 to pierce through the through-holes 212 in adjacent side walls 211, thus the multifunctional display is formed. The installation of the quick installation multifunctional display of the present invention only needs 2 workers to work for one day, which decreases the workload and saves time and thus lowers the installation costs; additionally, the installation as well as the disassembly of the quick installation multifunctional display of the present invention is simple, which facilitates maintenance.

Figure 3:
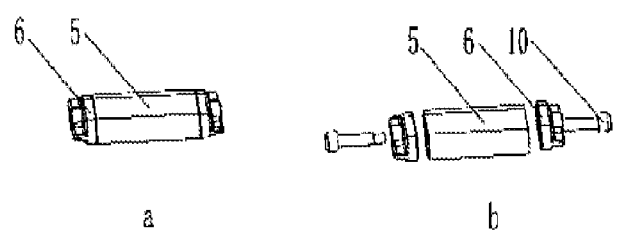
FIG. 3 is a schematic diagram of the connecting piece in the first embodiment of the present invention.

Furthermore, FIG. 1 and FIG. 3 illustrate the connecting piece in the first embodiment of the present invention, the connecting piece 3 comprises a connecting seat 5, and twist locks 6 respectively connected to two ends of the connecting seat 5 through screws 10 and being rotatable relative to end surfaces of the connecting seat 5; the following operations could be carried out to lock the display units 2: sheathe said connecting seat 5 of the connecting piece 3 in the through-holes 212 of the side walls 211 of two adjacent frames 2, lean the twist locks 6 against the inside surfaces of the side walls of the two frames 2 and then rotate the twist locks 6 by a certain degree (90° is the best). Two steps of operating the connecting piece, that is, "one-sheathing and one-twisting", could easily and quickly realize the installation or the disassembly of the display units.

Figure 4:
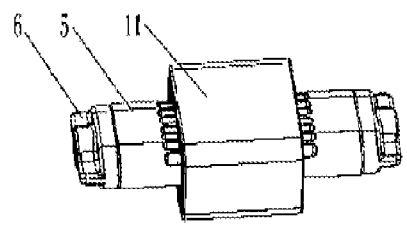
FIG. 4 is a schematic diagram of the improved connecting piece in the first embodiment of the present invention.
Figure 5:
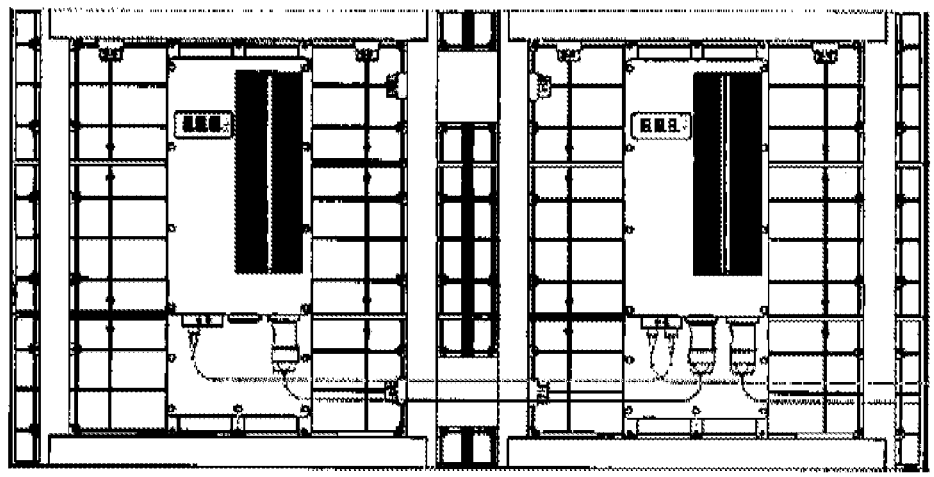
FIG. 5 is a schematic diagram of the quick installation multifunctional display having improved connecting pieces according to the first embodiment of the present invention.

Referring to FIG. 4 and FIG. 5, generally, both the circuit board 22 and the cover 23 provided by the display unit 2 are protruded along their length directions relative to left and right sides of the side walls 211 of the frame 21, in order to better connect and mount the display units 2, the connecting seat 5 of the connecting piece 3 is sleeved with a support 11, the support 11 is then arranged between two adjacent side walls.

The connecting piece in the first embodiment of the present invention is usually used for left/right connection of the display units.

Figure 6:
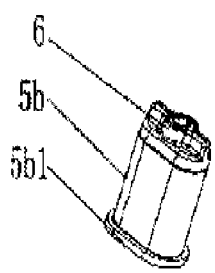
FIG. 6 is a schematic diagram of the connecting piece in the second embodiment of the present invention.

Furthermore, FIG. 6 illustrates the connecting piece in the second embodiment of the present invention, the connecting piece 3 comprise a connecting seat 5b and a twist lock 6, the connecting seat 5b has a stop block 5b1 at one end thereof, while the other end, through a screw 10, is connected with the twist lock 6 (not shown in FIG. 6) which is rotatable to the connecting seat; the following operations could be carried out to lock up the display units 2: sheathe the connecting seat 5b in the though-holes 212 of the side walls 211 of two adjacent frames 2, lean the inside surface of the stop block 5b1 against the inside surface of the side wall of one of a frame 2 adjacent to the stop block, and lean the inside surface of the twist lock 6 against the inside surface of the side wall of another frame adjacent to the twist lock, then rotate the twist lock 6 by a certain degree (90° is the best) to lock the display units.

The connecting piece in the second embodiment of the present invention is usually used for up/down connection of the display units.

Figure 7:
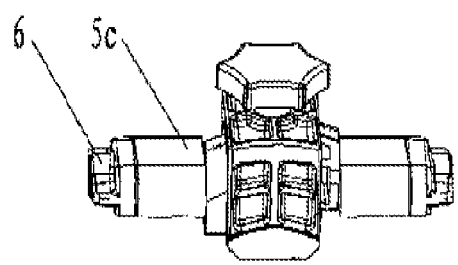
FIG. 7 is a schematic diagram of the connecting piece in the third embodiment of the present invention.
Figure 8:
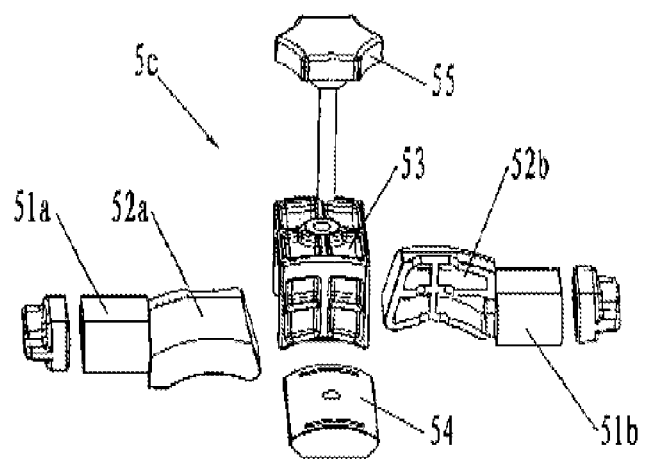
FIG. 8 is an explosive view of the connecting piece in the third embodiment of the present invention.

Furthermore, FIG. 7 to FIG. 9 illustrate the connecting piece in the third embodiment of the present invention, the connecting seat 5c comprises two connecting blocks 51a, 51b left-right opposite to each other, each of two connecting blocks providing with a turning block 52a, 52b on its end and the ends of the two connecting blocks being opposite to each other, a pressing block 53 sleeving outer sides of the turning blocks 52a, 52b, a locking block 54 arranged just below two turning blocks 52a, 52b, and a locking bolt 55, said pressing block 53 is in inverted-U shape, two turning blocks 52a, 52b are forward-backward symmetrically arranged and their two opposite sides are engaged with each other to be received in U-shaped notch of the pressing block 53; the top of said pressing block 53 has a hole in the centre thereof, the opposite sides of two turning blocks 52a, 52b are respectively provided with big-end-up half holes, and the locking block 54 has a screwed hole in the centre thereof, the locking bolt 55 extends the holes of both the pressing block 53 and the two turning blocks 52a, 52b to mesh with the screwed hole of the locking block 54; after the locking bolt 55 has been locked up with the locking block 54, the pressing block 53 is immovably fixed, however, the two turning blocks 52a, 52b could properly be rotated relative to the locking bolt 55 through their big-end-up half holes.

The connecting piece in the third embodiment of the present invention could be used for installing the display units in a curved way to form a surface-curved multifunctional display.

Figure 9A:
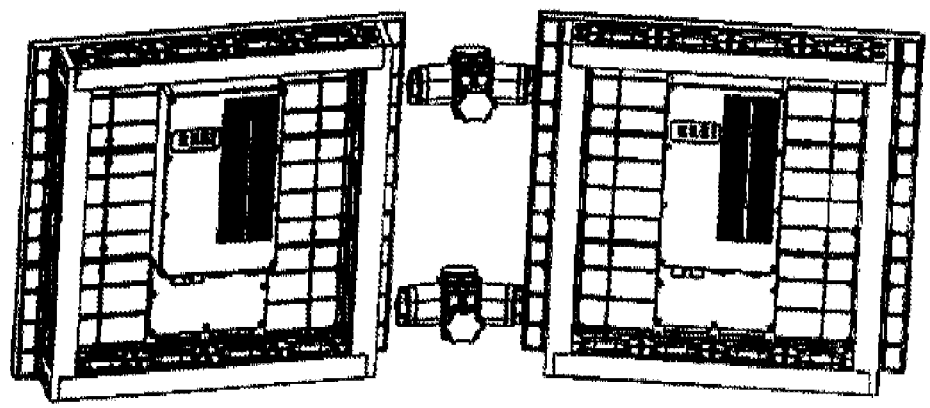
FIGS. 9a to 9g are schematic diagrams of the quick installation multifunctional display of the present invention when installed in a curved way.
Figure 9B:
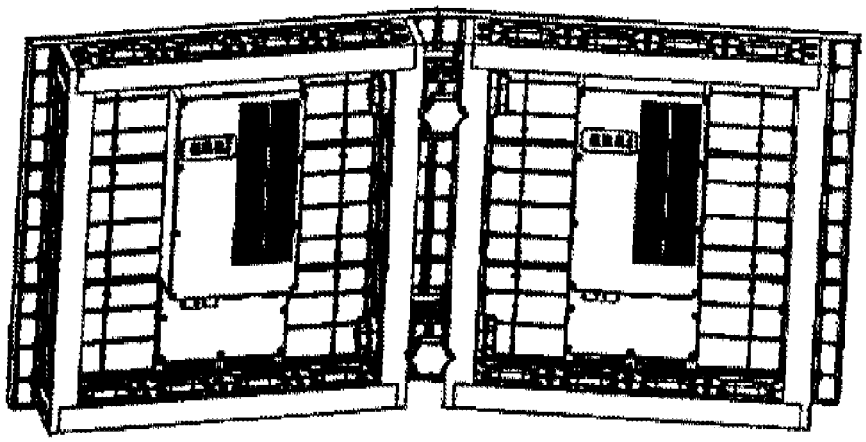
Figure 9C:
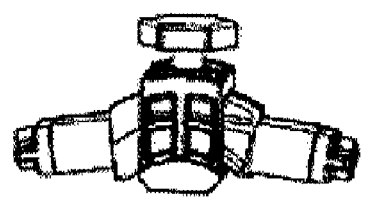
Figure 9D:
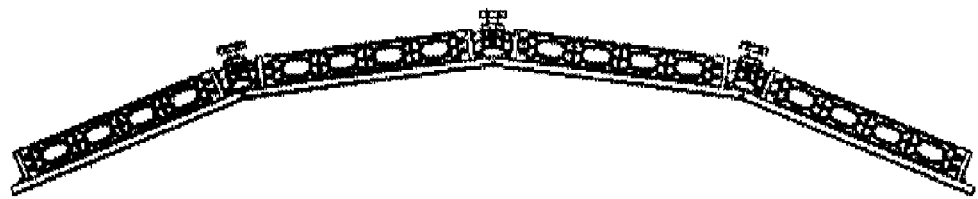

Referring to FIG. 9c and FIG. 9d, when needing an intrados multifunctional display, firstly properly rotate the turning blocks 52a, 52b of the connecting seat 5c outwards relative to the locking bolt 55 through their big-end-up half holes; after the turning blocks have been adjusted in place, screw tight the locking bolt 55 to fix the two turning blocks 52a, 52b; then respectively sheathe the connecting blocks 51a, 51b of the connecting seat 5c in the though-holes 212 of the side walls 211 of two adjacent frames 2, finally, lean the twist locks 6 against the inside surfaces of the side walls 211 of the two frames 2 and rotate the twist locks 6 by a certain degree (90° is the best) to lock the display units 2; successively connecting the display units makes the linked display units presented in an inward curve, and forms the intrados multifunctional display.

Figure 9E:
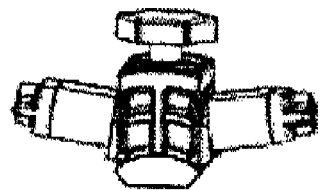
Figure 9F:

Referring to FIG. 9e and FIG. 9f, when needing an extrados multifunctional display, firstly properly rotate the turning blocks 52a, 52b of the connecting seat 5c inwards relative to the locking bolt 55 through their big-end-up half holes; after the turning blocks have been adjusted in place, screw tight the locking bolt 55 to fix the two turning blocks 52a, 52b; then sheathe the connecting blocks 51a, 51b of the connecting seat 5c in the though-holes 212 of the side walls 211 of two adjacent frames 2, finally, lean the twist locks 6 against the inside surfaces of the side walls 211 of the two frames 2 and rotate the twist locks 6 by a certain degree (90° is the best) to lock the display units 2; successively connecting the display units makes the linked display units presented in an outward curve, and forms the extrados multifunctional display.

Figure 9G:
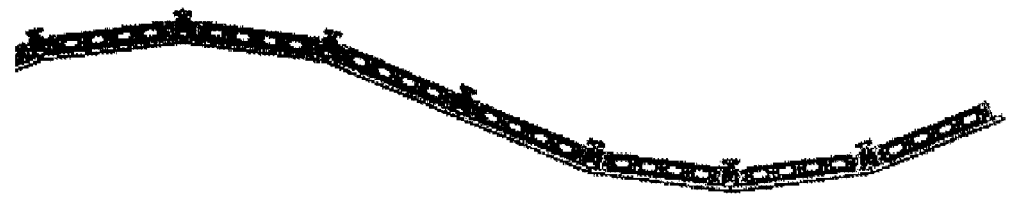

Referring to FIG. 9g, when needing an S-shaped curved multifunctional display, firstly properly rotate the turning blocks 52a which is one of the turning blocks 52a, 52b of the connecting seat 5c inwards relative to the locking bolt 55 through its big-end-up half hole, then properly rotate the other turning blocks 52b outwards relative to the locking bolt 55 through its big-end-up half hole, after the turning blocks have been adjusted in place, screw tight the locking bolt 55 to fix the two turning blocks 52a, 52b; then sheathe the connecting blocks 51a, 51b of the connecting seat 5c in the though-holes 212 of the side walls 211 of two adjacent frames 2, finally, lean the twist locks 6 against the inside surfaces of the side walls 211 of the two frames 2 and rotate the twist locks 6 by a certain degree (90° is the best) to lock the display units 2; the connection of the display units, in a combination of inward and outward curved way, could realize the formation of S-shaped multifunctional display.

Figure 10:
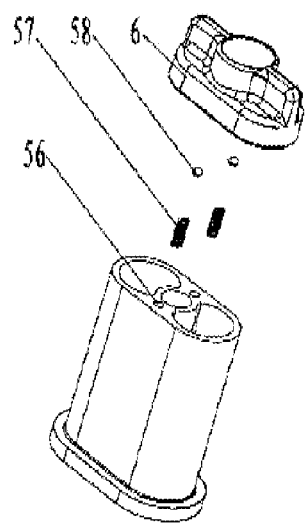
FIG. 10 is a schematic diagram of the self-locking structure of the connecting piece of the present invention.

Referring to FIG. 10, preferably, the connecting seat 5 and the twist lock 6 both provided by the connecting piece 3 which has been described in the above embodiments 1-3, have a twistlock self-locking structure at their connecting ends, said twistlock self-locking structure comprises two oppositely arranged blind holes 56 formed in an end surface of the connecting seat 5 which end surface is abutted against the twist lock 6, a spring 57 is arranged in the blind hole 56, a ball 58 is arranged on top of the spring 57, a slot is arranged at a corresponding position of an end surface of the twist lock 6 which end surface is abutted against the connecting seat 5, and the ball 58 could be partially popped up into the slot under the pressure of the spring 57 to fix the twist lock; when rotating the twist lock, the twist lock's surface could press the ball 58 into the blind hole, after the twist lock has been rotated in place, the ball 58 could also be popped up into the slot under the pressure of the spring 57. Thus, looseness of the twist lock could be avoided by utilization of the twistlock self-locking structure.

Preferably, the outside surface of the side wall 211 of the frame 21 is an inward-inclined plane, which could better realize the surface-curved multifunctional display.

Figure 11A:
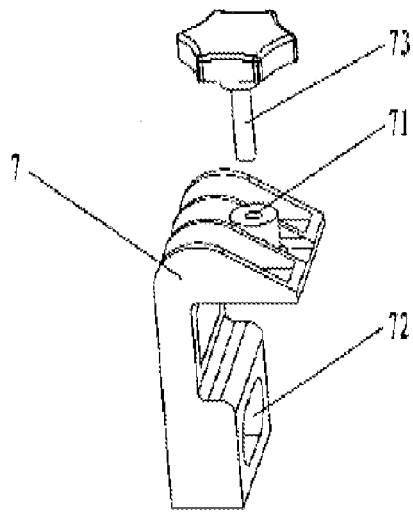
FIGS. 11a to 11c are schematic diagrams of the fastener of the present invention.
Figure 11B:
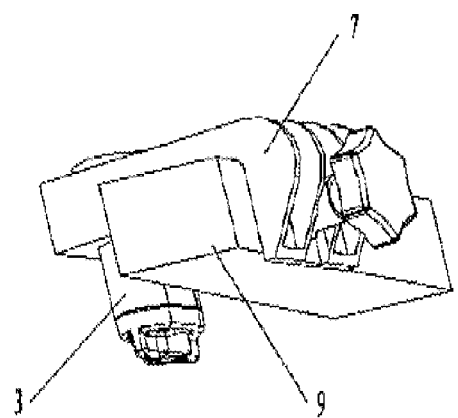
Figure 11C:
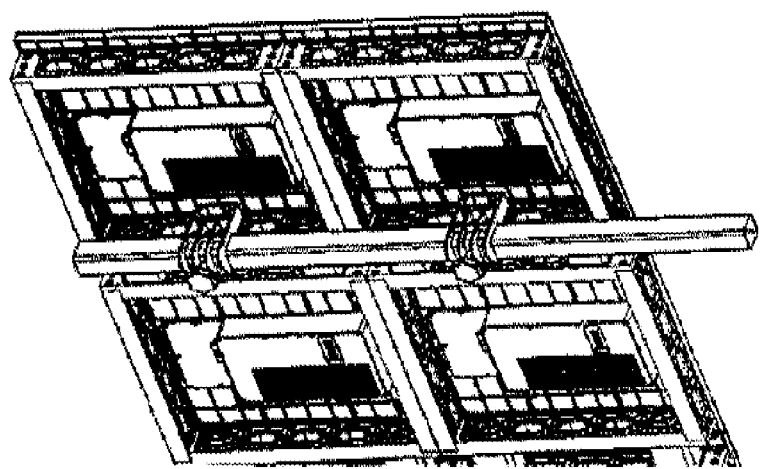

FIGS. 11a to 11c, preferably, the quick installation multifunctional display further comprises a fastener 7 having two ends being protruded outwards in the same direction, one end of the fastener 7 is provided with a screwed hole 71 that connects with a adjusting bolt 73, while the other end is provided with a connecting hole 72 that connects with the display unit 2 through the connecting pieces 3, and the middle portion of the fastener 7 is hanged over a steel frame 9; when mounting the quick installation multifunctional display, firstly, connect the connecting hole 72 of the fastener 7 to the quick installation multifunctional display 1 through the connecting pieces 3, then hang the fastener 7 over the steel frame 9, finally, adjust the adjusting bolt to mount the quick installation multifunctional display 1 on the steel frame 9.

Figure 12A:
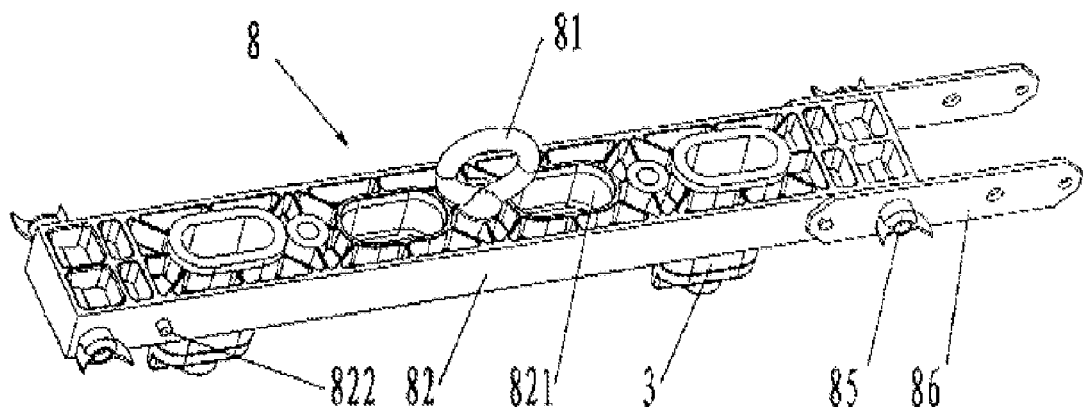
FIGS. 12a to 12b are schematic diagrams of the hanging assembly of the present invention.
Figure 12B:
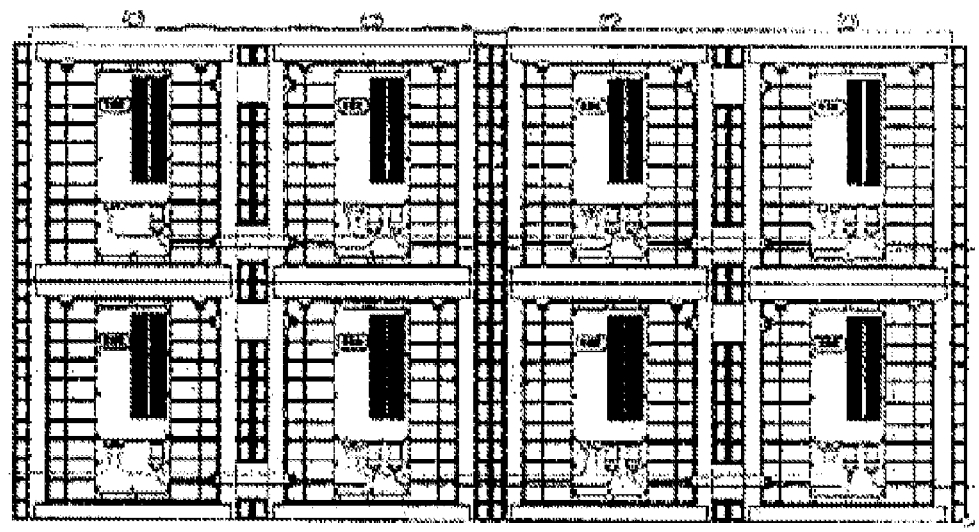

FIGS. 12a to 12b, preferably, the quick installation multifunctional display further comprises a hanging assembly 8, the hanging assembly 8 comprises a hanging beam 82 and at least a hanging ring 81 fixedly connected to the hanging beam 82, the hanging beam 82 is provided with connecting holes 821 which could be connected to the quick installation multifunctional display 1 through the connecting pieces 3; when mounting the quick installation multifunctional display, firstly, connect the hanging beam 82 of the hanging assembly 8 to the quick installation multifunctional display 1 through the connecting pieces 3, then hang both of the hanging assembly 8 and the multifunctional display 1 over a hook via the hanging ring 81.

Referring to FIG. 12b, more than one hanging assembly is usually required, and these hanging assemblies are linked together by a hanging beam connecting plate 86, said hanging beam connecting plate 86 has at least two circular holes, while two sides of both ends of the hanging beam are provided with screwed studs 822, the hanging beam connecting plate 86, through its circular holes, is then hanged on the screwed studs 822 provided by the same side of abutting ends of two adjacent hanging assemblies, both two sides of the adjacent hanging assemblies could hang the hanging beam connecting plates 86, which plates are then threadly connected to the screwed studs 822 through nuts 85 to be fixed.

Figure 13:
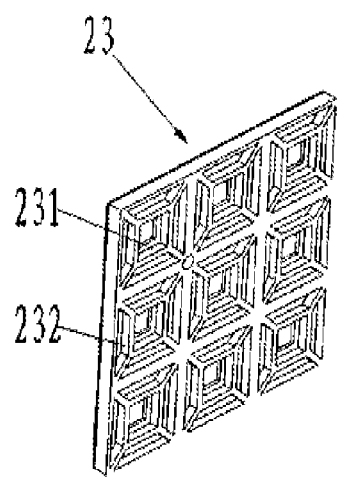
FIG. 13 is a partial schematic diagram of the cover of the present invention.

Referring to FIG. 13, preferably, the cover 23 of the display unit 2 is positioned at a side of the LED light bodies, and the LED light body has a homocentric square-shaped structure 231 with at least one layer, criss-cross slots are formed in the cover 23 and among the LED light bodies. The display's display contrast ratio could be heightened by using the homocentric square-shaped structure, and splicing gaps between the LED light bodies could be sheltered by the criss-cross slots.

While the preferred embodiments of the invention have been described above, it will be recognized and understood that various modifications may be made therein, and the appended claims are intended to cover all such modifications which may fall within the spirit and scope of the invention.

What is claimed:

1. A quick installation multifunctional display which comprises:
   at least two display units;
   connecting pieces for connecting the display units together; wherein
   said display unit comprises a frame formed by four side walls, and through-holes are formed in the side walls of the fame, said connecting pieces connect the display units together by the through-holes in the side walls of the frame;
   wherein said connecting pieces comprise a connecting seat, and twist locks respectively connected to two ends of the connecting seat which are rotatable relative to end surfaces of the connecting seat, said connecting seat is sheathed in the through-holes of the side walls of the two adjacent frames, said twist locks lean against inside surfaces of the side walls of the two frames to lock said display units.

2. The quick installation multifunctional display as claimed in claim 1, wherein said connecting seat comprises: two connecting blocks left-right opposite to each other;
   each of two connecting blocks providing with a turning block on its end and the ends of the two connecting blocks being opposite to each other;
   a pressing block sleeving outer sides of the turning blocks;
   a locking block arranged just below two turning blocks; and
   a locking bolt; wherein said pressing block is in inverted-U shape, two turning blocks are forward-backward symmetrically arranged and their two opposite sides are engaged with each other to be received in U-shaped notch of the pressing block; the top of said pressing block has a hole in the centre thereof, the opposite sides of two turning blocks are respectively provided with big-end-up half holes, and said locking block has a screwed hole in the centre thereof, said locking bolt extends the holes of both the pressing block and the two turning blocks to mesh with the screwed hole of the locking block.

3. A quick installation multifunctional display which comprises:
   at least two display units;
   connecting pieces for connecting the display units together; wherein
   said display unit comprises a frame formed by four side walls, and through-holes are formed in the side walls of the fame, said connecting pieces connect the display units together by the through-holes in the side walls of the frame;
   wherein said connecting pieces comprises a connecting seat and a twist lock, said connecting seat has a stop block at one end thereof, while the other end is connected with the twist lock which is rotated relative to the connecting seat, the inside surface of said stop block leans against the inside surface of said side wall of one of a frame adjacent to the stop block, while said twist lock leans against the inside surface of said side wall of another frame adjacent to the twist lock to lock said display units.

4. The quick installation multifunctional display as claimed in claim 1, wherein a blind hole is formed in an end surface of the connecting seat which end surface is abutted against said twist lock, a spring is arranged in the blind hole, a ball is arranged on top of the spring, a slot is arranged at an end surface of the twist lock which end surface is abutted against the connecting seat, and the ball is partially embedded into the slot under the pressure of the spring.

5. The quick installation multifunctional display as claimed in claim 1, wherein the display further comprises a fastener having two ends being protruded outwards in the same direction, one end of the fastener is provided with a screwed hole that connects with a adjusting bolt, while the other end is provided with a connecting hole that connects with said display unit through said connecting pieces, and the quick installation multifunctional display is mounted on a steel frame through the fastener.

6. The quick installation multifunctional display as claimed in claim 1, wherein the display further comprises a hanging assembly, the hanging assembly comprises a hanging beam and at least a hanging ring fixedly connected to the hanging beam, the hanging beam is provided with connecting holes which are connected to said display unit through said connecting pieces, and the quick installation multifunctional display is hanged over a hook via the hanging assembly.

7. The quick installation multifunctional display as claimed in claim 1, wherein said display unit further comprises
 a cover, and
 LED light bodies provided under the cover, wherein the cover is positioned at a side of the LED light bodies, and the LED light body has a homocentric square-shaped structure with at least one layer, criss-cross slots are formed in the cover and among the LED light bodies.

8. The quick installation multifunctional display as claimed in claim 1, wherein said display unit further comprises a control box, and the control box is inserted with a heat sink.

9. The quick installation multifunctional display as claimed in claim 2, wherein a blind hole is formed in an end surface of the connecting seat which end surface is abutted against said twist lock, a spring is arranged in the blind hole, a ball is arranged on top of the spring, a slot is arranged at an end surface of the twist lock which end surface is abutted against the connecting seat, and the ball is partially embedded into the slot under the pressure of the spring.

10. The quick installation multifunctional display as claimed in claim 3, wherein a blind hole is formed in an end surface of the connecting seat which end surface is abutted against said twist lock, a spring is arranged in the blind hole, a ball is arranged on top of the spring, a slot is arranged at an end surface of the twist lock which end surface is abutted against the connecting seat, and the ball is partially embedded into the slot under the pressure of the spring.

\* \* \* \* \*

UNITED STATES PATENT AND TRADEMARK OFFICE
CERTIFICATE OF CORRECTION

PATENT NO. : 8,985,832 B2  
APPLICATION NO. : 13/814937  
DATED : March 24, 2015  
INVENTOR(S) : Jun Liang et al.

Page 1 of 1

It is certified that error appears in the above-identified patent and that said Letters Patent is hereby corrected as shown below:

On the Title Page

Item (73), the name of the Assignee was misspelled as "Hunan Xiny Asheng Technology & Development Co., Ltd." and should be corrected to "Hunan Xinyasheng Technology & Development Co., Ltd."

Item (30), insert the foreign priority information of --CN201210097305.X filed on April 5, 2012--

Signed and Sealed this  
Twenty-first Day of July, 2015

Michelle K. Lee  
*Director of the United States Patent and Trademark Office*